United States Patent [19]

Okano et al.

[11] Patent Number: 4,526,643
[45] Date of Patent: Jul. 2, 1985

[54] DRY ETCHING APPARATUS USING REACTIVE IONS

[75] Inventors: Haruo Okano, Yokohama; Takashi Yamazaki, Kawasaki; Yasuhiro Horiike, Tokyo; Hiromichi Horie, Yokosuka, all of Japan

[73] Assignee: Tokyo Shibaura Denki Kabushiki Kaisha, Kawasaki, Japan

[21] Appl. No.: 578,082

[22] Filed: Feb. 8, 1984

[30] Foreign Application Priority Data

Mar. 24, 1983 [JP] Japan .................... 58-49142

[51] Int. Cl.³ .............. H01L 21/306; B44C 1/22; C03C 15/00; C23F 1/02
[52] U.S. Cl. .................... 156/345; 156/643; 156/646; 204/298
[58] Field of Search .............. 156/345, 643, 646; 204/192 E, 298; 313/359.1, 360.1, 361.1, 362.1, 363.1; 250/423 R, 492.3

[56] References Cited

U.S. PATENT DOCUMENTS 4,481,062 11/1984 Kaufman et al. .................. 156/345
4,483,737 11/1984 Mantei ............................ 156/345 X

FOREIGN PATENT DOCUMENTS 0065277 11/1982 European Pat. Off. .
56-161644 12/1981 Japan .
159026 10/1982 Japan ............................. 156/643

OTHER PUBLICATIONS

Patent Abstracts of Japan, vol. 2, No. 10, Jan. 25, 1978, pp. 10358E77 & JP-A-52-126176, 10358E77 & JP-A-52-126177.

Primary Examiner—William A. Powell
Attorney, Agent, or Firm—Oblon, Fisher, Spivak, McClelland & Maier

[57] ABSTRACT

A dry etching apparatus using reactive ions is disclosed. A housing in which a workpiece is etched is provided with a cathode electrode on which the workpiece is mounted, and an anode electrode arranged opposite the cathode electrode. An etching gas is supplied to the housing, and pressure inside of the housing is held at a certain level. High frequency voltage is applied between the cathode and anode electrodes. A plurality of magnets are arranged outside of the housing to generate magnetic fields around the cathode electrode. The plurality of magnets are separated from one another, with a predetermined clearance being interposed therebetween, to form an endless track. The plurality of magnets are moved along the endless track, to thereby cause the magnetic fields to be moved in one direction on the cathode electrode.

19 Claims, 11 Drawing Figures

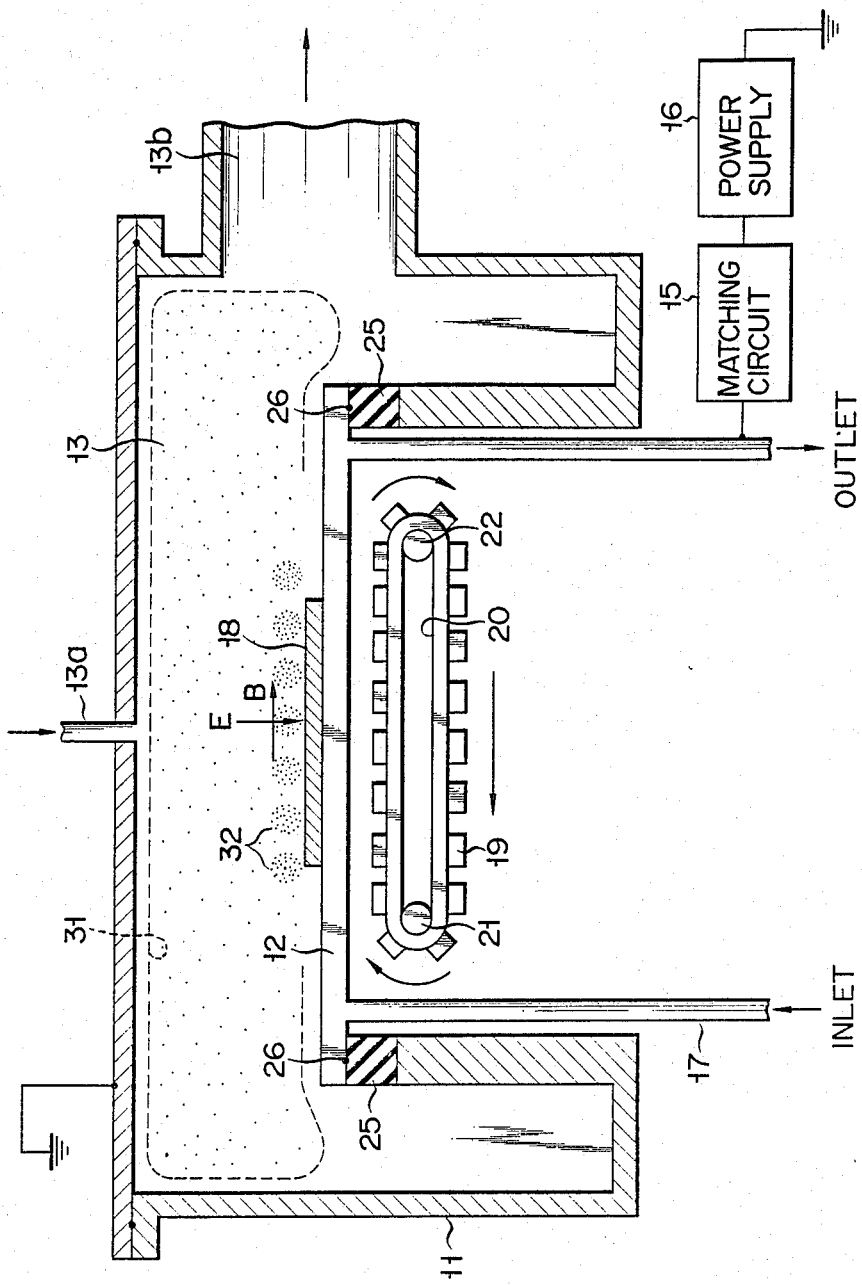

DRY ETCHING APPARATUS USING REACTIVE IONS

BACKGROUND OF THE INVENTION

The present invention relates to a dry etching apparatus using reactive ions.

The IC has recently been more and more miniaturized, with the result that an ultra-miniaturized element having a minimum dimension of 1 to 2 $\mu$m is now being tested. An ultra-miniaturized element such as this is made by using the so-called RIE (reactive ion etching) method. An etching gas such as $CF_4$, for example, is introduced into an evacuated container which has parallel plate electrodes. A workpiece is mounted on the cathode electrode and a high frequency voltage is applied between the anode and the cathode electrodes, to generate a glow discharge between the electrodes. The positive ions in a plasma are accelerated by a cathode fall voltage generated on the surface of the cathode electrode, and vertically entered into the sample to physically and chemically etch the workpiece. However, with this RIE, which uses parallel plate electrodes, the glow discharge is comparatively poor in its gas dissociation effect. Thus, the $SiO_2$ etching rate attained by using a $CF_4 + H_2$ gas, for example, is 300 to 500 Å/min, at most. It thus takes more than 30 minutes to etch an $SiO_2$ film which is 1 $\mu$m in thickness, which is extreme disadvantage in terms of mass production. For this reason a speedup of the etching rate is desired.

A dry etching method has been disclosed in Japanese Patent Disclosure (KOKAI) No. 56-161644, wherein magnets are arranged under the cathode electrode on which a sample or workpiece is mounted, and wherein etching is performed by moving said magnets. As shown in FIG. 1, electrons 5 are caused to undergo a cycloidal motion, by both a magnetic field 3 generated at a clearance 2 between the magnetic poles, which forms a closed loop; and by an electric field 4 generated between the electrodes, which field is perpendicular to this magnetic field 3. The collision frequency between the introduced reactive gas and the electrons is sharply increased by this electron motion, to generate a lot of reactive ions. These ions are entered vertically into a sample or workpiece 6, to achieve a high rate anisotropic etching.

However, the apparatus of this kind has the following drawback. Only track-like area 7, where magnetron-discharge of high density takes place, is etched when the magnetic pole clearance 2 remains unchanged. For the purpose of uniformly etching the whole of the workpiece 6, therefore, it becomes necessary to scan the magnetic pole clearance 2 more largely than the longer diameter of the workpiece 6. FIG. 2 is a characteristic curve showing the results which were obtained by measuring etching rate as a function of distances D from the edge of the workpiece 6, said etching rate being that found in the case of etching $SiO_2$ by gas $CF_4$. The magnetic pole clearance 2 was left unchanged, being separated from the edge of the workpiece 6 by 30 mm, as shown in FIG. 3. As may be seen from FIG. 2, etching of about 1000 to 2000 Å was achieved for ten seconds, near the edge of the workpiece 6, and the etching rate became lower and lower, in approaching the edge of the workpiece 6. Even if the return of the scanning had been extremely fast, taking no more than 0.05 seconds, for example, it would have been tantamount to a case wherein the magnetic pole clearance 2 remained unchanged for two seconds, on both sides of the workpiece 6, in the course of about eighty time-scannings. Therefore, the depth of etching achieved at the edge of the workpiece, in the course of this number of scannings and under the conditions shown in FIG. 3, comes to have an approximate value of 500 Å. This fast etching at the circumferential area of the workpiece is a cause which reduces the possibility of uniformly etching the whole of the workpiece. As a step toward the elimination of this cause, the magnetic pole clearance 2 might be scanned widely. In such a case, however, the apparatus would need to be made large-sized, thereby reducing the etching rate. This will be undesirable when the workpiece becomes larger (e.g., larger than 6 inches) in the future.

SUMMARY OF THE INVENTION

The object of the present invention is to provide a dry etching apparatus using reactive ions, which apparatus is capable of uniformly etching a workpiece at a high rate.

This and other objects may be achieved by a dry etching apparatus which uses reactive ions and comprises a housing means in which a workpiece is etched, said housing means having a cathode electrode on which the workpiece is mounted and an anode electrode arranged opposite the cathode electrode, a means for supplying an etching gas into and exhausting it from the housing means, a means for applying high frequency voltage between the cathode and the anode electrodes to produce a plasma, a magnetic means arranged outside of the housing means to form a magnetic field on the cathode electrode, said magnetic means having a plurality of magnets separated at a predetermined distance from each other to form an endless track, and a means for moving the magnets along the endless track to successively oppose each of the magnets to the cathode electrode so that magnetic field may be moved on the cathode electrode.

The gist of the present invention resides in the fact that a plurality of magnetic pole clearances are moved in a direction along an endless track, to continually move high density plasma areas on a workpiece in such a direction as to equalize, on the workpiece, the integral value of the time during which the workpiece is subjected to the high density plasma areas.

According to the present invention, the magnetic pole clearances are scanned in a given direction and, therefore, the etching rate is not so greatly increased, particularly in the vicinity of the edge of the workpiece, as may be seen in the case where the magnetic pole clearances are reciprocating scanned, thereby enabling the entire workpiece to be uniformly etched at a high rate of speed. In addition, it becomes unnecessary to make the width of scanning substantially larger than the longitudinal axis of the workpiece, as in the case of reciprocating scanning the magnetic pole clearances, thereby enabling the apparatus to be small-sized. This is extremely effective in making the diameters of workpieces such as semiconductor wafers larger, and is also an asset in the field of semiconductor manufacturing engineering.

BRIEF DESCRIPTION OF THE DRAWINGS

FIGS. 9 and 10 show second and third examples of the dry etching apparatus according to the present invention.

DETAILED DESCRIPTION OF THE PREFERRED EMBODIMENTS

Figure 4:
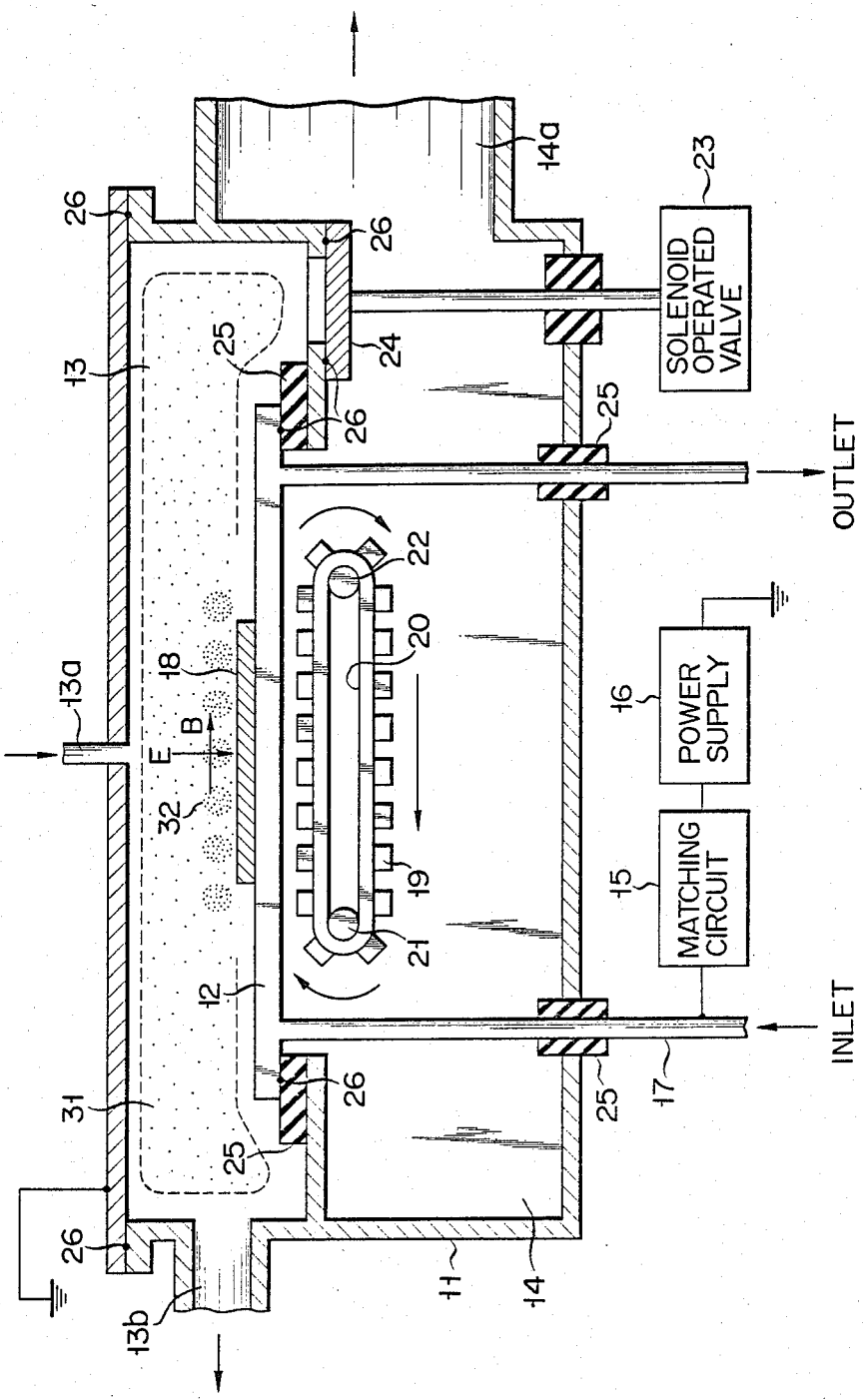
FIG. 4 shows a first example of dry etching apparatus according to the present invention.

A first example of the dry etching apparatus according to the present invention may be described as follows, with reference to FIG. 4. A container 11 made of stainless steel, for example, which container is grounded, has an etching chamber 13 and a magnet chamber 14. The etching chamber 13 and the magnet chamber 14 are partitioned by a cathode electrode 12. The outer wall of the etching chamber 13 which opposes the cathode electrode 12 serves as an anode electrode. The cathode electrode 12 is electrically insulated from the outer walls of the etching and magnet chambers 13 and 14 by means of electrical insulators 25. High frequency power is supplied from a power supply 16 to the cathode electrode 12 through a matching circuit 15. A magnetron, for example, is used as the power supply 16. The cathode electrode 12 is water-cooled by a water cooling pipe 17, which also serves as a lead for supplying high frequency power. The etching chamber 13 is provided with an opening 13a through which an etching gas such as $CF_4$ is introduced, and an opening 13b through which the etching gas is exhausted. The etching chamber 13 is so adjusted as to have a certain gas pressure. A workpiece 18 to be etched is mounted on the cathode electrode 12 in the etching chamber 13.

Figure 5:
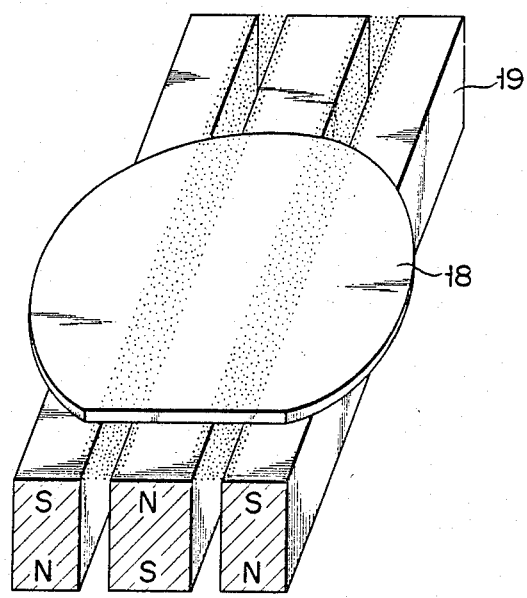
FIG. 5 is a perspective view showing an arrangement of permanent magnets employed in the apparatus of FIG. 4.

A plurality of permanent magnets 19, which are separated from one another in such a way as to have a certain clearance therebetween, are so arranged in the magnet chamber 14 as to draw an endless track. The endless track means a closed loop, for example. More specifically, the plurality of permanent magnets 19 are attached, with a certain clearance to be sustained between them, to the outer face of a belt 20 which forms the endless track; and are moved in one direction of the track, by means of rotation mechanisms 21 and 22. The permanent magnet 19 is bar-shaped, as shown in FIG. 5. The longitudinal length of the permanent magnet 19 is larger than that of the workpiece 18. The permanent magnets 19 are so located that their N and S poles are alternated with each other. The permanent magnets 19 are also so located that their longitudinal axes are perpendicular to their direction of movement, and those of them which are on the belt 20 oppose the backside of the cathode electrode 12. Magnetic field B shown by an arrow in FIG. 4 and its reversed magnetic field B are thus formed alternately on the workpiece 18. The magnet chamber 14 is provided with an opening 14a through which the gas is exhausted. In order to prevent electric discharge from being generated between the outer wall of the magnet chamber 14 and the cathode electrode 12, the magnet chamber 14 is exhausted through the gas drain opening 14a, to generate a vacuum less than $1.33 \times 10^{-2}$ Pa ($=1 \times 10^{-4}$ Torr). Arranged between the magnet chamber 14 and the etching chamber 13 is a sluice or gate valve 24 which is driven by a solenoid valve 23. Each of the chambers 13 and 14 is shut off by this sluice valve 24 at the time of etching. The container 11 is sealed by O-rings 26. The surface of the cathode electrode 12 is covered by a protective layer, such as a layer of carbon, shield the cathode electrode 12 from attack (not shown).

An etching gas such as $CF_4$ is introduced into the etching chamber 13, through the gas introducing opening 13a, and the etching chamber 13 is held at $10^{-2}$ Torr. When high frequency power (1 kW, 13.56 MHz) is then applied to the cathode electrode 12, glow discharge is generated between the cathode electrode 12 and the anode electrode (or the upper wall portion of the etching chamber 13), to form a low density plasma area 31. At the same time, a magnetron discharge is generated at each of the clearances between the magnets, due to the action of electrical and magnetic fields E, B which are perpendicularly crossed with each other; and electrons repeat their collisions against $CF_4$ particles many times during performance of the cycloidal motion in the E×B direction, thereby forming high density plasma areas 32 along the clearances between the magnets. The high density plasma areas 32 are moved on the workpiece 18 in one direction by scanning the permanent magnets 19 in one direction of the endless track. The workpiece 18, $SiO_2$ film formed on a semiconductor wafer, for example, is thus etched at high speed. Since the movement of the high density plasma areas 32 is only in one direction at this time, the periods during which the workpiece 18 is subjected to the high density plasma areas 32 at its optional points become substantially equal to one another.

According to the first example of the dry etching apparatus, conventional etching irregularities can be eliminated, thereby enabling the workpiece 18 to be etched uniformly and at a high rate of speed. In addition, the lengths of the magnets which are so arranged on the endless track as to oppose the cathode electrode 12 may correspond substantially to the longitudinal axis of the workpiece 18, thus allowing the apparatus to remain small-sized. Although a conventional problem which occurs is one in which the etching rate is reduced as the scanning width of the magnet is increased, the first example of the dry etching apparatus causes the workpiece 18 to be continually subjected to the high density plasma areas 32, so that the etching rate cannot be reduced. Therefore, even a large workpiece can be etched at a high rate of speed. The etching rate obtained when the clearances between the magnets remain unchanged may still reach one of approximately 5 $\mu$m/min. In other words, the first example of the dry etching apparatus enables the etching rate to reach 1 to 2 $\mu$m/min, which is substantially equal to the value obtained by the conventional apparatus, even when the strength of magnetic field generated between the magnets is reduced and the density of the high frequency power applied is made small enough. Therefore, the first embodiment is extremely practical in application.

Figure 1:
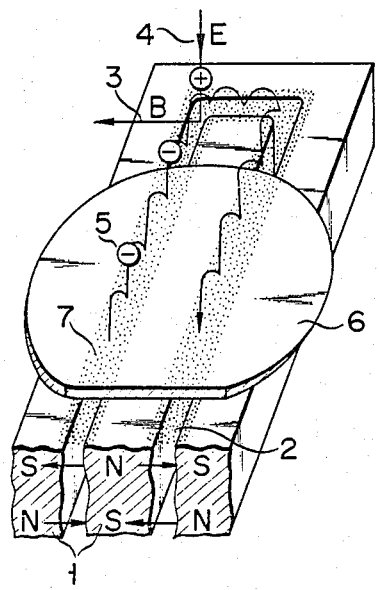
FIG. 1 is a view intended to explain the conventional dry etching method.
Figure 2:
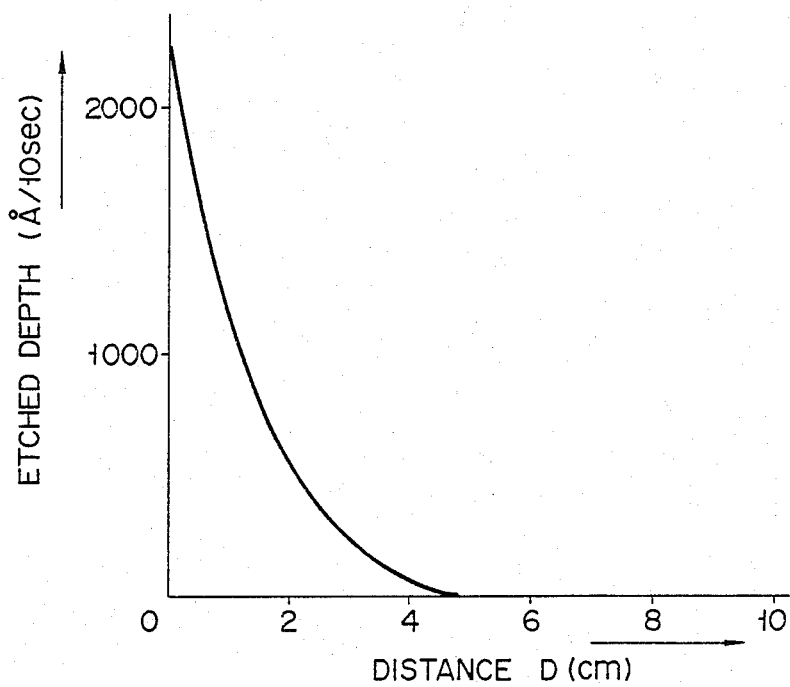
FIG. 2 is a graph showing the relationship between the etched depths of a workpiece and distances D from the edge of the workpiece.
Figure 3:
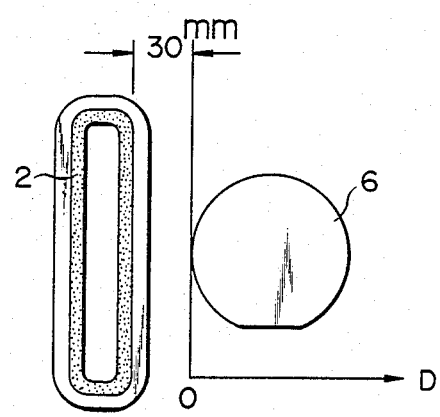
FIG. 3 is a view showing an experimental condition under which the relationship shown in FIG. 2 is obtained.
Figure 6:
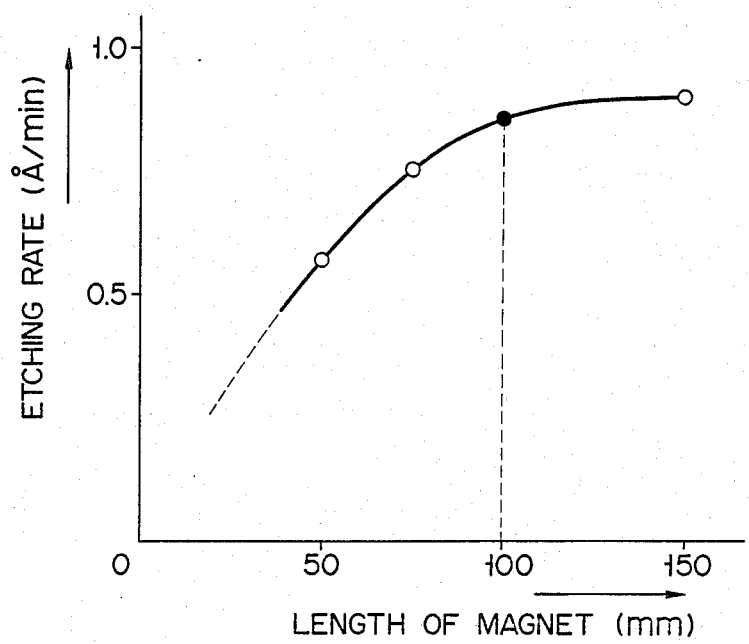
FIG. 6 is a characteristic curve showing the relationship between the length of the magnet and the etching rate.

Since bar-shaped magnets 19 are employed in the first embodiment, the clearances between the magnets do not form a closed loop, as opposed to the case shown in FIG. 1. It is therefore suspected that ionizing effect is reduced, because the cycloidal motion of electrons in the direction of E×B is shut off on the halfway point of the track. However, it has been found from the test results obtained by the inventor that etching rate can be left almost unchanged, even if only the arc portions are cut off from the closed loop shown in FIG. 1. FIG. 6 shows a characteristic curve plotted from the results obtained by measuring the change of etching rate, in relation to the length of the longitudinal axis of the magnet. This length 150 mm represents that of magnets forming the closed loop shown in FIG. 1, and those shorter than 150 mm represent that of magnets made by cutting predetermined lengths from both ends of the closed-loop-shaped magnets, when viewed in the longitudinal direction. As may be seen from FIG. 6, the etching rate denoted by the black point of FIG. 6 is substantially equal to that of the closed-loop-shaped magnet. The black point corresponds to the magnet made by cutting only the arced portions from the closed-loop-shaped magnet. Therefore, the first embodiment employs those magnets which are made by cutting off only the arced portions of the closed-loop-shaped magnets shown in FIG. 1. The magnets may form a closed loop, as shown in FIGS. 1 and 3, even in the case of the first embodiment. It is, however, more advantageous if independent magnets (bar-shaped magnets) are employed in the first embodiment, since the mechanisms for rotating the endless track may thereby be simplified.

Figure 7:
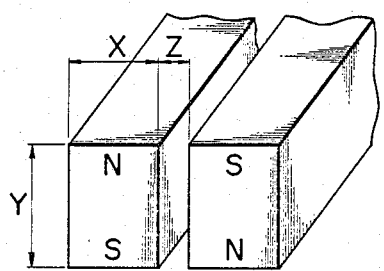
FIG. 7 is a view showing the dimensions of the magnet and the clearance between magnets.
Figure 8:
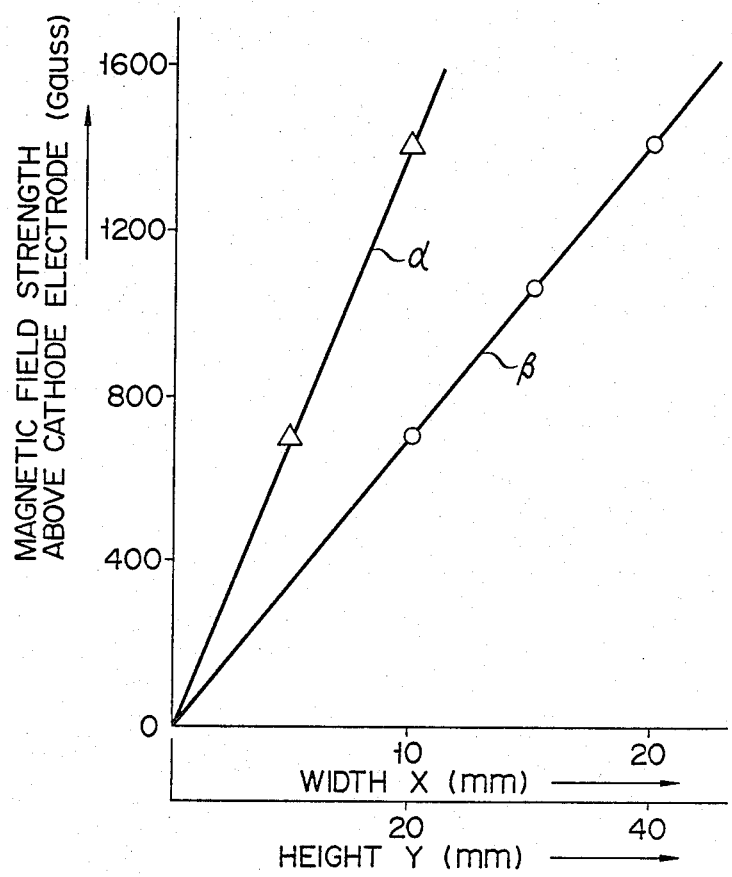
FIG. 8 is a characteristic graph showing the relationship between the dimensions of the magnet and the strength of magnetic field.

FIG. 8 shows the results obtained by measuring the strength of the megnetic field 7 mm above the upper face of each of those magnets which have a rectangular section, as shown in FIG. 7. The axis of abscissas represents width X and height Y of a permanent magnet; curve α, a clearance Z(=3 mm) between the magnets; and curve β, another clearance Z(=6 mm) between the magnets. It can be found from FIG. 8 that a strong magnetic field of about 750 Gausses is generated even when magnets each having a width X of 10 mm and a height Y of 20 mm and which are separated from one another to have a clearance Z of 6 mm between them are employed. Magnets made of rare earth elements such as Sm—Co, for example, were useful in generating a strong magnetic field.

A second example of a dry etching apparatus according to the present invention may be described as follows, with reference to FIG. 9. Since parts which are the same as those of FIG. 4 are represented by the same numerals, a detailed description of such parts will be omitted here.

This second embodiment differs from the first one, in that the magnetic field generating section, which comprises magnets 19, a belt 20 and rotation mechanisms 21, 22, is suspended mid-air. With an apparatus having a magnetic field generating section for generating magnetic fields and using the magnets arranged on the endless track as in the second embodiment, it is possible to gain an etching rate which is substantially equal to that obtained by the conventional apparatus, even when the strength of the magnetic field generated between the magnets is reduced and the density of high frequency power is sufficiently reduced. Therefore, the cathode electrode 12 can be made thicker than 10 mm, and there is almost no danger of generating a discharge, even when a highly-evacuated magnet chamber is not provided. Thus, according to the second embodiment, the same effects as were achieved by the first embodiment can be attained here, and the structure of the apparatus may be simplified.

Figure 10:
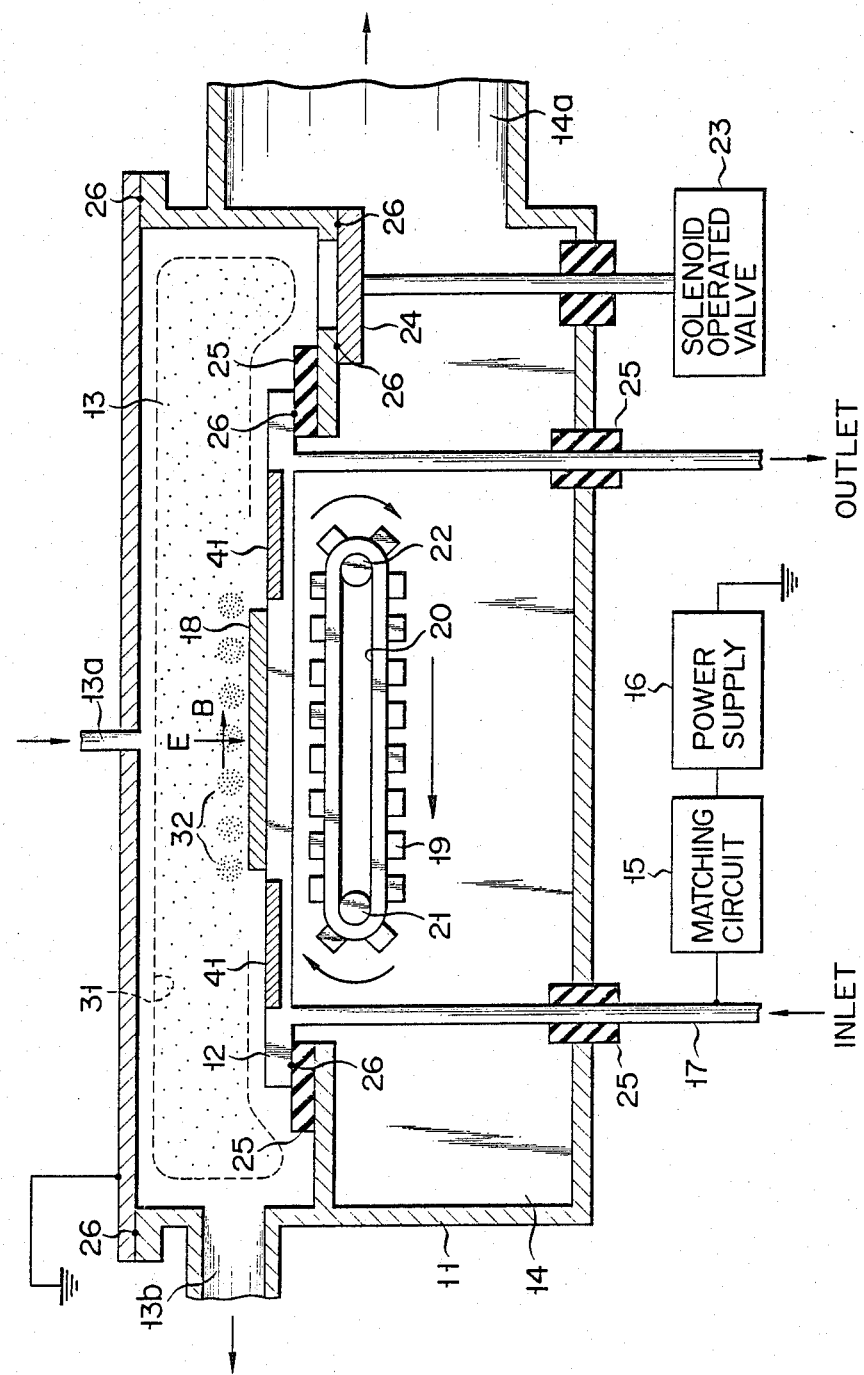

FIG. 10 shows a third embodiment of a dry etching apparatus according to the present invention. Since the same parts as those shown in FIG. 4 are represented by the same numerals, they will not be described in detail. The third embodiment differs from the first, in that a magnetic material is embedded in a part of the cathode electrode 12. More specifically, an iron plate 41 is embedded, enclosing the upper face area of the cathode electrode 12 on which the workpiece 18 is mounted.

When the clearance between the magnets travels under the iron plate 41, most of the magnetic fluxes pass through the iron plate 41, having a high permeability, thereby generating almost no magnetic field on the iron plate 41. As the result, the high density plasma area 32 is not formed in the vicinity of the outer circumference of the workpiece 18. Accordingly, the third embodiment allows the same effects as were obtained by the first embodiment to be achieved here, and allows its construction to be samller, as well.

Figure 11:
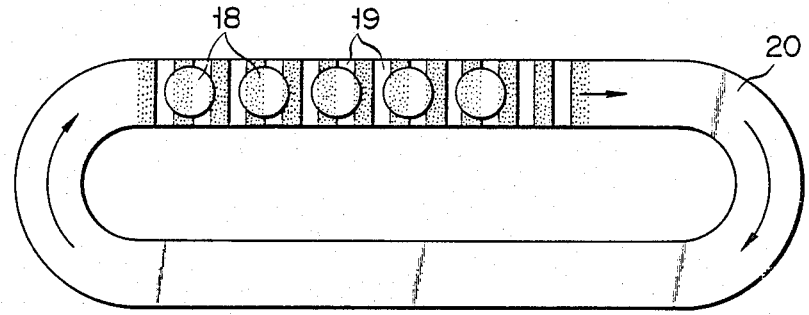
FIG. 11 shows another magnetic-field-generated section employed in the dry etching apparatus according to the present invention.

Another magnetic field generating section according to the present invention may be described as follows, with reference to FIG. 11. The surface of the belt 20 is moved parallel to the cathode electrode 12 in this case. The permanent magnets 19 are arranged on the surface of the belt 20, with a certain clearance interposed between the magnets, to form an endless track. Namely, the plane formed by the endless track is parallel to the cathode electrode. When a plurality of workpieces 18 are laid on the cathode electrode, they can thus be dry-etched at the same time, enhancing mass productivity.

It should also be understood that the magnetic field generating section is not limited to those employed by the above-described embodiments. If the permanent magnets are located on an endless track with a clearance interposed between them, and at least a portion of them are opposed to the underside of the cathode electrode, a different type of magnetic field generating section may be used. Further, the clearance between the magnets, the strength of their magnetic fields, and the number of magnets may be appropriately determined, with reference to a given case. Furthermore, electromagnets may be used instead of permanent magnets.

Moreover, the dry etching apparatus according to the present invention may be applied not only to an $SiO_2$ film, but to various other kinds of films, as well. In addition, the kind of etching gas introduced into the etching chamber may be appropriately selected, depending on the properties of the workpiece to be etched.

What is claimed is:

1. A dry etching apparatus using reactive ions, comprising:
    a housing means for etching a workpiece, said housing means being provided with a cathode electrode on which the workpiece is mounted, and an anode electrode arranged opposite the cathode electrode;
    a means for supplying an etching gas into and exhausting the same from the housing means;

a means for applying a high frequency voltage between the cathode and the anode electrodes to produce a plasma;

a magnetic means arranged outside of the housing means for generating magnetic fields on the cathode electrode, said magnetic means including a plurality of magnets which are so arranged, with a certain clearance interposed between the magnets, as to form an endless track; and a means for moving the magnets along the endless track, to successively oppose each of the magnets to the cathode electrode, in such a way that the magnetic fields may be moved on the cathode electrode.

2. A dry etching apparatus according to claim 1, wherein the endless track forms a closed loop of predetermined shape.

3. A dry etching apparatus according to claim 1, wherein the plane of said endless track is substantially perpendicular to the face of said cathode electrode.

4. A dry etching apparatus according to claim 1, wherein the plane of said endless track is substantially parallel to the face of said cathode electrode.

5. A dry etching apparatus according to claim 1, wherein each of the magnets is bar-shaped; and the magnets are separated from one another on the endless track, to form a band-like clearance between the magnets, with each of the magnets being longer than the longitudinal axis of said workpiece.

6. A dry etching apparatus according to claim 1, wherein two of the plurality of magnets form a magnet pair, with one of the paired magnets enclosing the other completely, to cause an attraction between the paired magnets; the clearance formed between the paired magnets forms a closed loop; and each of the paired magnets arranged under the cathode electrode is longer than the longitudinal axis of said workpiece.

7. A dry etching apparatus according to claim 1, wherein said magnet is made of rare earth elements.

8. A dry etching apparatus according to claim 1, wherein the magnetic means is arranged within a space whose pressure is held at less than $1.33 \times 10^{-2}$ Pa.

9. A dry etching apparatus according to claim 1, wherein the magnetic means is arranged in mid-air.

10. A dry etching apparatus using reactive ions comprising:

a housing means for etching a workpiece, which means is provided with a cathode electrode on which the workpiece is mounted, and an anode electrode arranged opposite the cathode electrode;

a means for supplying an etching gas into and exhausting the same from the housing means;

a means for applying a high frequency voltage between the cathode and the anode electrodes to produce a plasma;

a magnetic means arranged outside of the housing means for generating magnetic fields on the cathode electrode, said magnetic means including a plurality of magnets which are separated from each other, with a predetermined clearance being interposed between the magnets to form an endless track;

a means for moving the magnets along the endless track, to successively oppose each of the magnets to the cathode electrode, in such a way that the magnetic fields may be moved on the cathode electrode;

a means for decreasing the magnetic field around the area of the cathode electrode on which the workpiece is mounted, said decreasing means being disposed around the area.

11. A dry etching apparatus according to claim 10, wherein the decreasing means is made of a magnetic material having high permeability; and the magnetic fluxes emitted from the magnets are thus collected by the magnetic material, to thereby decrease the magnetic field around the area of the cathode electrode on which the workpiece is mounted.

12. A dry etching apparatus according to claim 10, wherein the endless track forms a closed loop of predetermined shape.

13. A dry etching apparatus according to claim 10, wherein the plane of said endless track is substantially perpendicular to the face of said cathode electrode.

14. A dry etching apparatus according to claim 10, wherein the plane of said endless track is substantially parallel to the face of said cathode electrode.

15. A dry etching apparatus according to claim 10, wherein each of the magnets is bar-shaped; the magnets are separated from one another on the endless track, to thereby form a band-like clearance between the magnets; and each of the magnets is longer than the longitudinal axis of said workpiece.

16. A dry etching apparatus according to claim 10, wherein two of the plurality of magnets form a magnet pair, with one of the paired magnets enclosing the other completely, to cause an attraction between the paired magnets; the clearance formed between the paired magnets forms a closed loop; and each of the paired magnets arranged under the cathode electrode is longer than the longitudinal axis of said workpiece.

17. A dry etching apparatus according to claim 10, wherein said magnet is made of rare earth elements.

18. A dry etching apparatus according to claim 10, wherein the magnetic means is located within a space whose pressure is held at less than $1.33 \times 10^{-2}$ Pa.

19. A dry etching apparatus according to claim 10, wherein the magnetic means is located in mid-air.

* * * * *